United States Patent
Tanaka et al.

(10) Patent No.: US 6,803,547 B2
(45) Date of Patent: Oct. 12, 2004

(54) APPARATUS FOR AND METHOD OF HEATING SEMICONDUCTOR DEVICES

(75) Inventors: Tohru Tanaka, Tokyo (JP); Yasuhisa Kitajima, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 65 days.

(21) Appl. No.: 10/108,190

(22) Filed: Mar. 27, 2002

(65) Prior Publication Data

US 2002/0139791 A1 Oct. 3, 2002

(30) Foreign Application Priority Data

Mar. 28, 2001  (JP) ........................................ 2001-094131

(51) Int. Cl.[7] .............................. F27B 5/12; F27D 3/00; G01R 31/02
(52) U.S. Cl. ....................... 219/392; 219/388; 219/400; 324/760
(58) Field of Search ................................ 219/388, 392, 219/400; 324/501, 760, 763; 432/152, 154

(56) References Cited

U.S. PATENT DOCUMENTS

| | | | | |
|---|---|---|---|---|
| 3,656,058 A | * | 4/1972 | Leathers ..................... | 324/760 |
| 4,729,246 A | * | 3/1988 | Melgaard et al. .......... | 73/865.6 |
| 4,926,118 A | * | 5/1990 | O'Connor et al. .......... | 324/760 |
| 5,650,732 A | * | 7/1997 | Sakai ......................... | 324/755 |
| 5,859,540 A | * | 1/1999 | Fukumoto ................... | 324/760 |
| 5,903,163 A | * | 5/1999 | Tverdy et al. .............. | 324/760 |
| 5,969,537 A | * | 10/1999 | Kanno et al. ............... | 324/760 |
| 6,091,062 A | * | 7/2000 | Pfahnl et al. ............... | 219/497 |
| 6,097,201 A | * | 8/2000 | Slocum ...................... | 324/760 |
| 6,104,183 A | * | 8/2000 | Kobayashi et al. ...... | 324/158.1 |
| 6,204,679 B1 | * | 3/2001 | Gray, III .................... | 324/760 |
| 6,291,799 B1 | * | 9/2001 | Heyer et al. ................ | 219/388 |
| 6,313,652 B1 | * | 11/2001 | Maeng ....................... | 324/760 |
| 6,313,654 B1 | * | 11/2001 | Nansai et al. .............. | 324/760 |
| 6,445,203 B1 | * | 9/2002 | Yamashita et al. ......... | 324/760 |
| 6,564,165 B1 | * | 5/2003 | Mailloux et al. ........... | 702/136 |

FOREIGN PATENT DOCUMENTS

| | | | |
|---|---|---|---|
| JP | 04-115546 | * | 4/1992 |
| JP | 11-271391 | * | 10/1999 |
| KR | 2002017268 | * | 3/2002 |

* cited by examiner

Primary Examiner—Joseph Pelham
(74) Attorney, Agent, or Firm—Flynn, Thiel, Boutell & Tanis, P.C.

(57) ABSTRACT

An apparatus and method for heating semiconductor devices (DUTs) having a variety of package shapes. The apparatus has a plurality of trays on which DUTs are mounted. A heating chamber with a plurality of stages, house the tray. A tray moving mechanism moves the trays so as to be disposed within the heating chamber and outside of the heating chamber. The method has the steps of supplying the DUTs on a tray, heating the DUTs supplied on each tray, and relocating and measuring the DUTs.

17 Claims, 5 Drawing Sheets

APPARATUS FOR AND METHOD OF HEATING SEMICONDUCTOR DEVICES

FIELD OF THE INVENTION

The invention relates to an apparatus for and a method of heating semiconductor devices. The heating apparatus of semiconductor devices is provided, e.g. in a high temperature handler and it heats semiconductor devices to measure electronic characteristics in a high temperature environment.

BACKGROUND OF THE INVENTION

The heating apparatus of semiconductor devices is provided in a high temperature handler and heats devices under test (hereinafter referred to as DUT) to an intended temperature in advance so as to measure electric characteristics of the semiconductor devices in a high temperature environment. The structure of a conventional heating apparatus of semiconductor devices is described next with reference to FIG. 3 and FIG. 4. FIG. 3 is a plan view showing the conventional heating apparatus of semiconductor devices, and FIG. 4 is a sectional view of FIG. 3, wherein depicted by 10 is a DUT, 20 is a hand, 30 is a heat plate, 40 is a heat block, 41 is a heater and 42 is a heat insulation wall.

In FIGS. 3 and 4, plural recesses are formed on the upper surface of the heat plate 30 in transverse directions. Each DUT 10 is placed on one of the plural recesses. The heat plate 30 is disposed on the heat block 40. The heater 41 is built in the heat block 40. If the heater 41 is energized or turned on in a state where each DUT 10 is placed on the heat plate 30, each DUT 10 is heated via the heat plate 30 owing to heat conduction. The heat plate 30 is adjusted in constant heat distribution so that each DUT 10 is heated uniformly. Each DUT 10 which is heated to an intended temperature is moved from the heat plate 30 by the hand 20. Meanwhile, in the heating apparatus of semiconductor devices, the heat insulation wall 42 is provided on the outer side of the heat block 40 to prevent the heat release from the heater 41.

Another conventional heating apparatus of semiconductor devices is shown in FIG. 5 and FIG. 6. FIG. 5 is a plan view showing the conventional heating apparatus of semiconductor devices, and FIG. 6. is a sectional view of FIG. 5, wherein depicted by 11a is a DUT before it is heated, 11b is a DUT after it was heated, 21 is a hand, 31 is carriers, 43 is a heating chamber, and 44 is a heat insulation wall. In FIGS. 5 and 6, the interior of the heating chamber 43 covered with the heat insulation wall 44 is kept at a given temperature by circulating hot air. Each carrier 31 capable of holding four pieces of DUT circulates and moves inside the heating chamber 43. The DUT 11a before it is heated is placed on the carrier 31 by the hand 21. The DUT placed on the carrier 31 is heated to an intended temperature while the carrier 31 moves inside the heating chamber 43, and the heated DUT 11b is removed from the carrier 31 by the hand 21 at a housing position shown in FIG. 5.

In the conventional heating apparatuses of semiconductor devices as set forth above, it takes about slightly below 60 seconds to about 180 seconds for heating, e.g. a package type DUT from a room temperature to 125° C.

In the case of a DUT which takes a relatively long time to be measured, it is possible to secure time to heat the DUT sufficiently utilizing measuring time as standby time so that a volume of a preheating chamber may be reduced. However, in the case of a DUT which takes a relatively short time to be measured, it is necessary to increase the volume of the heating chamber for heating a next DUT to an intended temperature while the heated DUT is measured. Accordingly, in the case of a DUT which takes a relatively short time to be measured, it is not avoidable that the heating apparatus becomes large sized and also the entire handler becomes large sized and a cost for increasing power supply capacity to heat the heating apparatus increases. This becomes more eminent if the throughput of an autohandler is improved by increasing the number of parallel measurements.

An autohandler has been required to cope with a variety of shapes of packages. It is necessary to prepare a variety of heat plates 30 or carriers 31 in accordance with a variety of shapes of packages according to the conventional heating apparatuses of semiconductor devices, causing a problem of convenience and cost thereof.

SUMMARY OF THE INVENTION

The invention has been developed to solve or at least minimize the foregoing problems, and has an object to provide a heating apparatus for semiconductor devices capable of coping with a variety of DUT packages with low cost, and of restraining the heating apparatus for semiconductor devices from being large sized and of minimizing the increase of power supply capacity.

To achieve the above object, the invention employs first means comprising plural trays on which multiple semiconductor devices are mounted, a heating chamber having plural stages in which each tray is housed, and a tray moving mechanism for moving each tray inside and outside the heating chamber.

The invention has second means wherein each tray in the first means is standardized and the tray moving mechanism has plural plates for holding and placing the plural trays thereon.

The invention has third means wherein the first or second means further has heat units for keeping the semiconductor devices warm at an intended temperature, wherein the semiconductor devices are moved from inside the heating chamber to outside thereof in a state where they are placed on each tray.

The invention has fourth means wherein the heat units in the third means have a blower for blowing hot air toward the semiconductor devices.

The invention also comprises a method of heating semiconductor devices in a heating apparatus for semiconductor devices including plural trays on which multiple semiconductor devices are mounted, a heating chamber having plural stages in each of which a tray is housed, and a tray moving mechanism for moving each tray into and out of the heating chamber, wherein the method comprises a supplying step for supplying semiconductor devices on each tray, a heating step for heating the semiconductor devices supplied on each tray to an intended temperature, a step for relocating and measuring the semiconductor devices which are heated in the heating step from each tray, wherein these steps are repeated, and wherein the supplying step and the relocating and measuring step relative to the other tray are completed during the heating step relative to the one tray.

PREFERRED EMBODIMENT OF THE INVENTION

A preferred embodiment of a heating apparatus for semiconductor devices according to the invention is described next with reference to the attached drawings.

Figure 1:
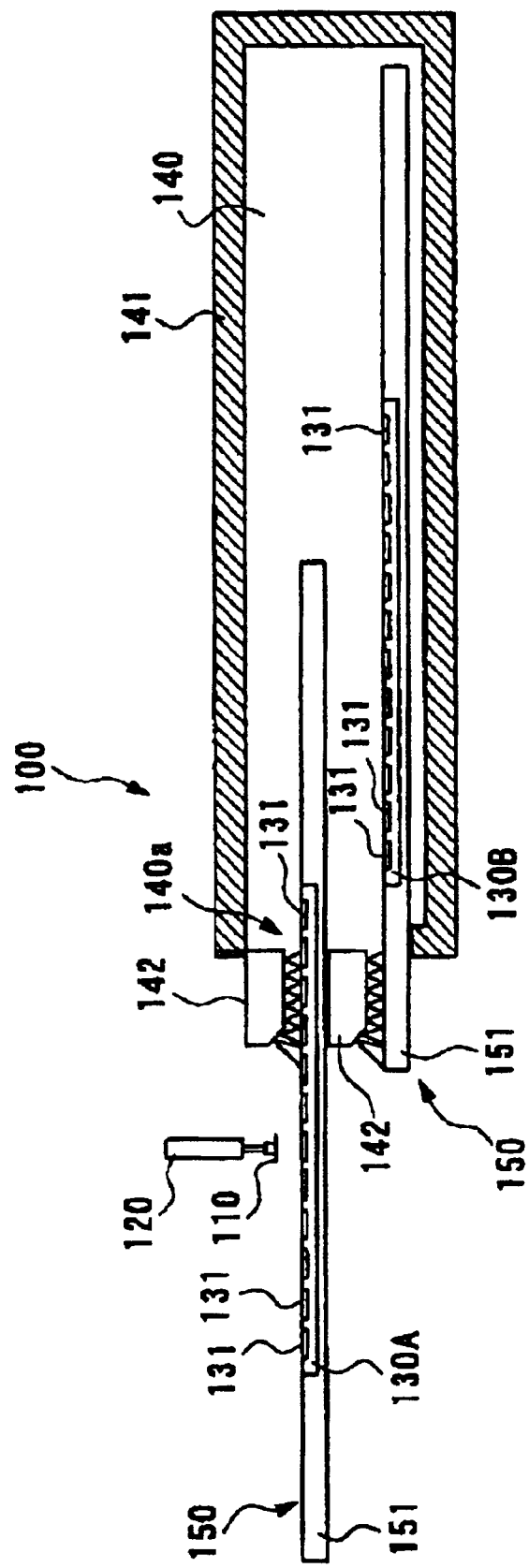
FIG. 1 is a side view showing the structure of the heating apparatus for semiconductor devices according to a preferred embodiment of the invention.
Figure 2:
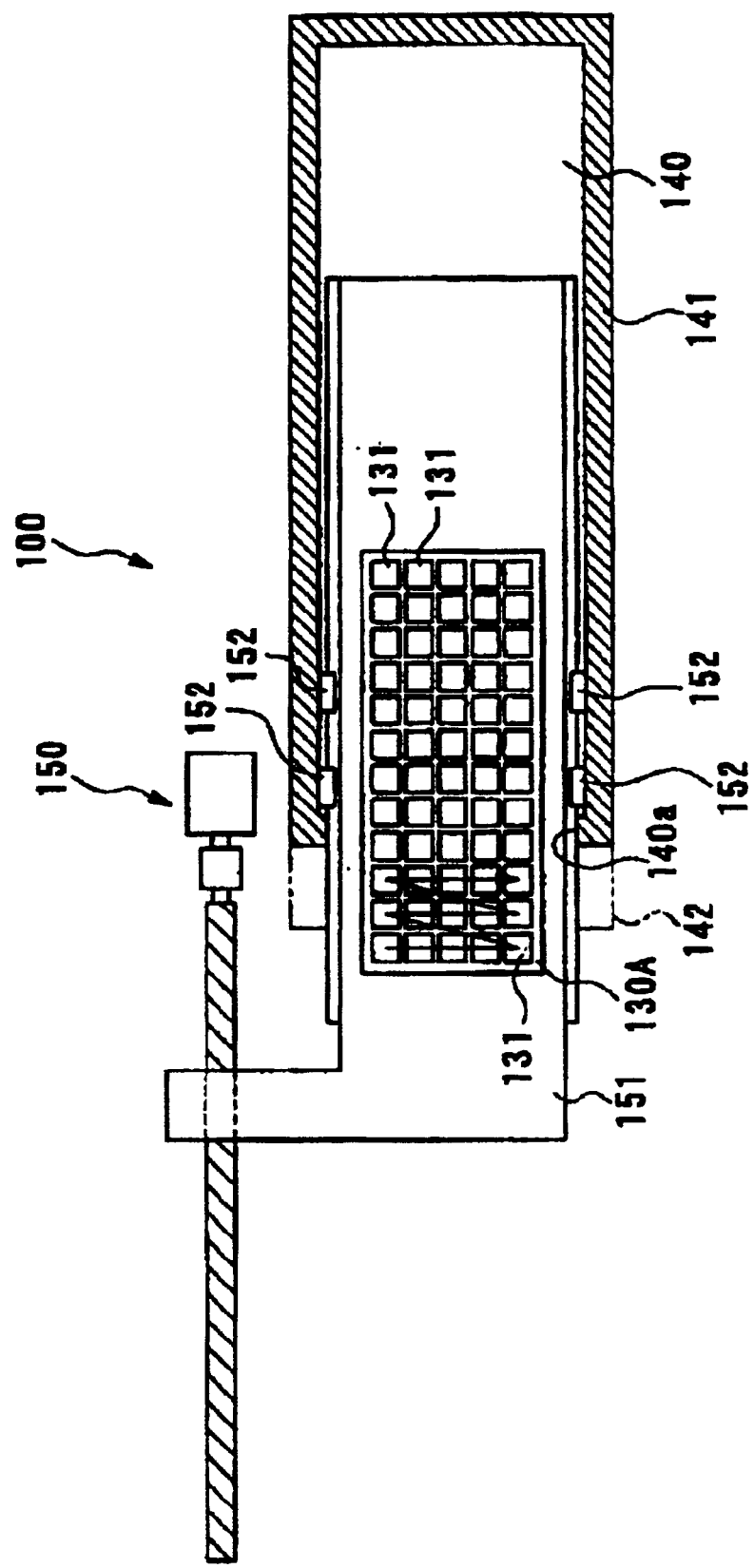
FIG. 2 is a sectional view showing an order of supplying and housing semiconductor devices according to the preferred embodiment of the invention.
Figure 3:
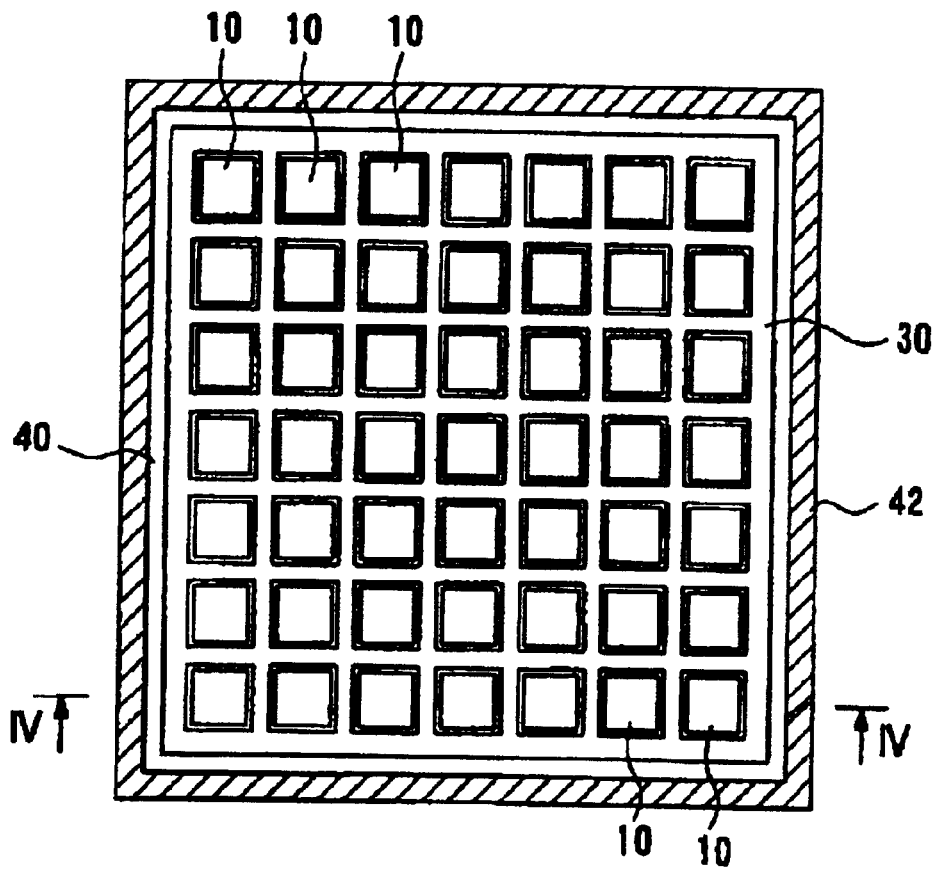
FIG. 3 is a plan view showing an example of a conventional heating apparatus for semiconductor devices.
Figure 4:
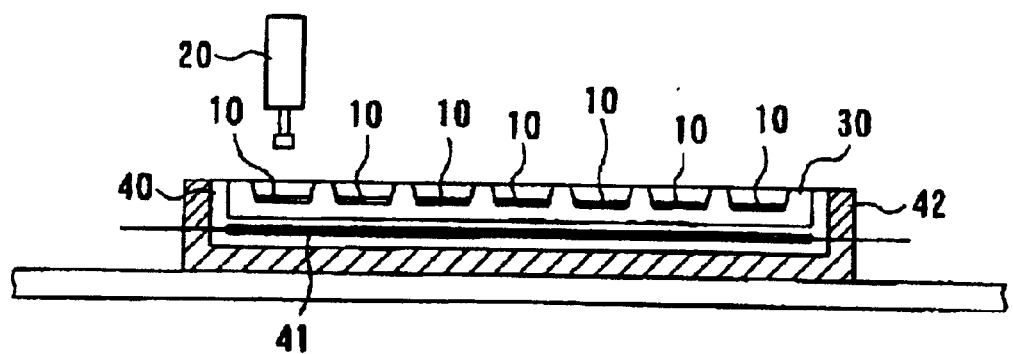
FIG. 4 is a sectional view taken along a line IV—IV in FIG. 3.
Figure 5:
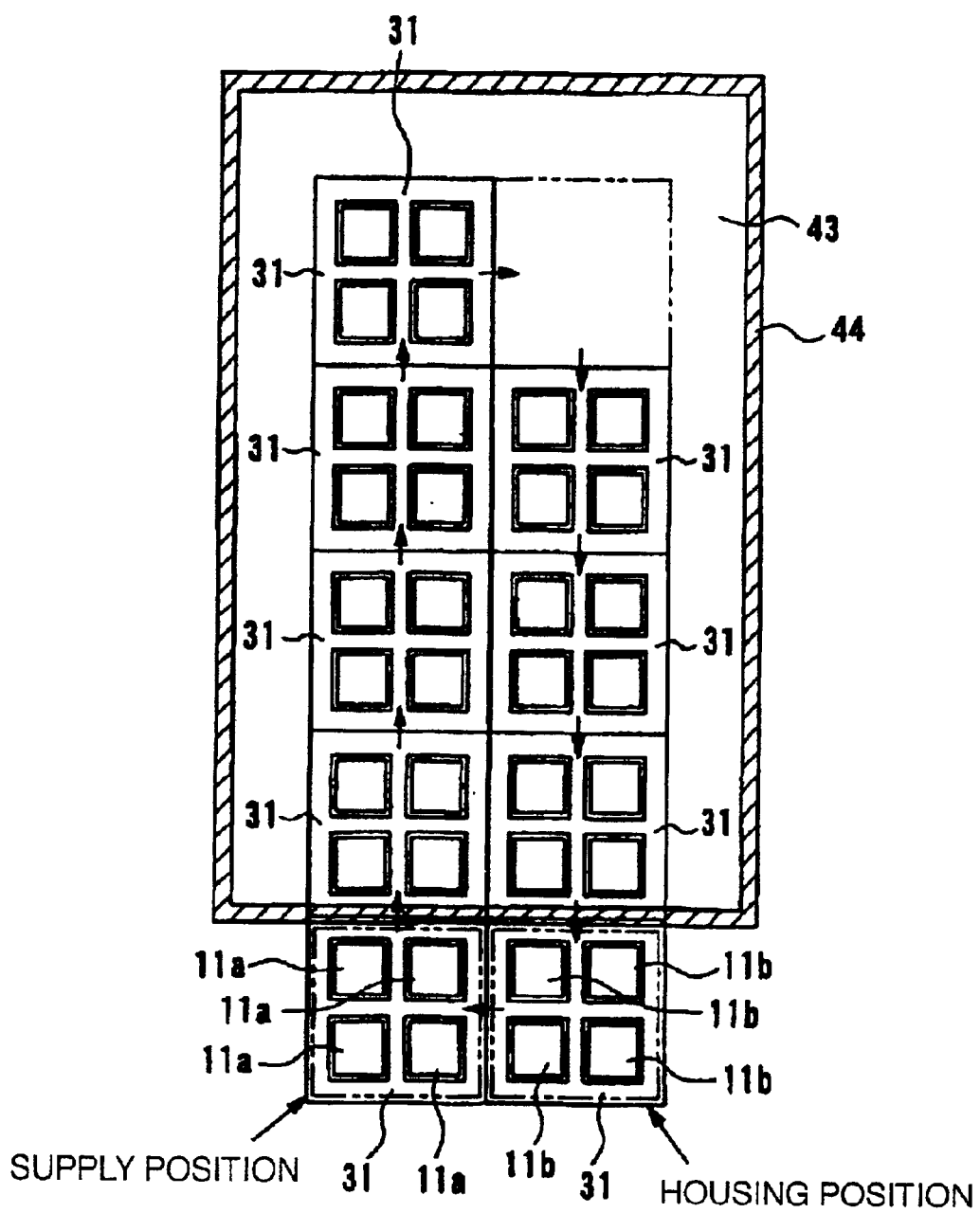
FIG. 5 is a plan view showing an example of another conventional heating apparatus for semiconductor devices.
Figure 6:
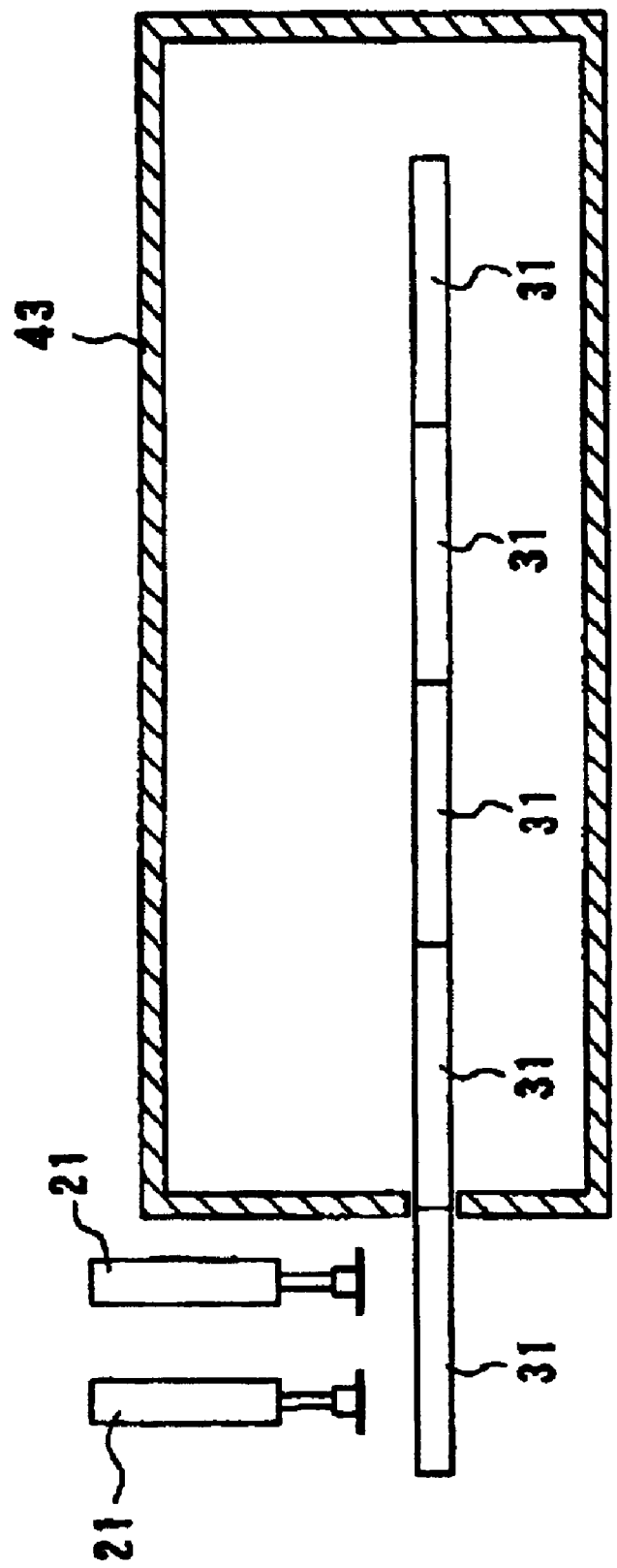
FIG. 6 is a side view showing the supply and housing of semiconductor devices in FIG. 5.

FIG. 1 and FIG. 2 show a heating apparatus 100 for semiconductor devices according to a preferred embodiment of the invention. FIG. 1 is a side sectional view and FIG. 2 is a plan sectional view in FIG. 1 as viewed from the top thereof. In FIG. 1 and FIG. 2, depicted by 110 is a semiconductor device (DUT), 120 is a hand, 130A, 130B are trays, 140 is a heating chamber, 142 are heat units and 150 are tray moving mechanisms. In FIGS. 1 and 2, although the single DUT 110 is installed, a plurality of DUTs are explained hereinafter.

The heating apparatus 100 heats the DUTs 110 at an intended temperature in advance so as to measure electric characteristics of each DUT 110 in a high temperature environment. That is, the heating apparatus 100 is a preheating unit provided in the autohandler. The hand 120 is provided in the autohandler and moves each DUT 110 while subject to a vacuum, or sucking and holding it.

The trays 130A, 130B employ standardized trays which are used for housing, holding and shipping the DUTs 110. Plural recesses 131 corresponding to the package shapes of the DUTs 110 are formed on the trays 130A, 130B in transverse directions. A DUT 110 is placed in each recess 131.

The heating chamber 140 is covered with a heat insulation wall 141 for circulating hot air therein, and keep the temperature thereof at an intended temperature. The heating chamber 140 has plural stages (two stages in this embodiment) in a vertical direction in which the trays 130A, 130B are arranged, and has an opening 140a through which the trays 130A, 130B are moved in and out. The heat units 142, i.e. blowers for blowing hot air toward the DUTs 110 placed on the trays 130A, 130B, are provided outside the heating chamber 140 adjacent the opening 140a for individually corresponding to each of the trays 130A, 130B. Thus, the hot air emanates from the heat unit and moves to the semiconductor device, thereby transferring heat to the semiconductor device. So the heat unit need not move.

Each tray moving mechanism 150 moves the trays 130A, 130B inside and outside the respective heating chamber 140 by moving plates 151 which are horizontally movably supported by linear guides 152. Each tray moving mechanism 150 is a linearly movable unit which is movable by a ball screw 153 and is disposed outside the heating chamber 140. The upper stage tray 130A or the lower stage tray 130B is disposed on the upper surface of the plates 151. The tray moving mechanisms 150 can move the plates 151 from a state where the tray 130A or the tray 130B is disposed outside the heating chamber 140 to a state where the tray 130A or the tray 130B is housed in the heating chamber 140, thereby stopping the plates 151 at an arbitrary position. The tray moving mechanism 150 is provided by a pair of relatively movable plates 151 for separately moving the trays 130A, 130B (plates 151) provided in plural stages (two stages in this embodiment).

With the heating apparatus 100 having such a structure, the DUTs 110 supplied onto the trays 130A, 130B by the hand 120 are moved by each tray moving mechanism 150 to the inside of the heating chamber 140 and the DUTs 110 are heated to an intended temperature in the heating chamber 140. The DUTs 110, which were heated to an intended temperature, are then moved outside the heating chamber 140 by each tray moving mechanism 150 where they are subject to a vacuum, or sucked, held and moved by the hand 120 so as to be subjected to measurement while the intended temperature of the DUTs 110 is maintained due to the heat unit 142 being disposed at the opening 140a and the hand 120 being positioned closely adjacent the heating unit 140.

The heating method using the heating apparatus 100 of the invention is described next. First, the DUTs 110 are supplied to the empty tray 130A by the hand 120 (supplying step). At this time, the hand 120 is successively moved up and down as shown in FIG. 2 at a position shown in FIG. 1, while the tray 130A is moved right and left in FIG. 1 by the tray moving mechanism 150 in synchronization with the movement of the hand 120 so that the DUTs 110 are successively placed on the recesses 131 of the tray 130A as shown in FIG. 2. In such a manner, when all the DUTs 110 are supplied to the recesses 131 of the tray 130A, the tray 130A is moved inside the heating chamber 140 by each tray moving mechanism 150 so that the DUTs 110 held by the tray 130A of the upper stage are heated (heating step).

Subsequently, the DUTs 110 are supplied to the tray 130B from the hand 120 and the tray moving mechanism 150 (supplying step), so that the tray 130B is moved to the inside of the heating chamber 140 by the tray moving mechanism 150 and the DUTs 110 held by the tray 130B are heated (heating step).

When the supplying step relative to the lower stage tray 130B is completed and the heating step relative to the upper stage tray 130A is completed, thereby heating the DUTs 110 held by the tray 130A to an intended temperature, the tray 130A is moved outside the heating chamber 140 by the tray moving mechanism 150 with the heated DUTs 110 housed in the tray 130A. Next, in the housing step, the tray 130A is first moved out to the position shown in FIG. 2. The DUTs 110 positioned at the outermost row of the recesses 131 of the tray 130A are held by the hand 120 in a location or state outside the heating chamber 140 where they are close to and hence are warmed by the heat unit 142 as shown in FIG. 1, and they are subjected to measurement in a conventional manner. Subsequently, the tray 130A is pulled out from the heating chamber 140 by the tray moving mechanism 150 by a distance of about one row of the recesses 131, and likewise the DUTs 110 housed in the second row of the tray 130A are subjected to measurement. When these operations are successively performed, the DUTs 110 on the tray 130A are all moved and subjected to measurement.

Meanwhile, the relocating and measuring step may be switched to or alternated with the supplying step. That is, upon completion of relocating and measuring of the DUTs 110 of given number (five pieces in one row in this embodiment), the next DUTs 110 to be heated corresponding to the number of the DUTs removed from the tray 130A are supplied to the tray 130A without moving the tray 130A. Thereafter, the tray 130A is moved to relocate and measure the heated DUTs from the next row and thereafter supply the DUTs 110 of the subsequent rows, and all the DUTs 110 are subjected to the relocating and measuring and supplying. In such operations, an interval for housing the DUTs 110 to be subjected to measurement can be maintained constant.

Upon completion of the relocating and measuring step and the supplying step relative to the DUTs 110 on the tray 130A, the tray 130A is moved into the heating chamber 140 to start the heating step of the DUTs 110 thereon. Likewise, subsequently upon completion of the heating step relative to the DUTs 110 on the tray 130B, the DUTs 110 on the tray 130B may be subjected to the relocating and measuring step, the supplying step and the heating step, whereby the plural DUTs 110 can be continuously heated and supplied so as to be subjected to measurement.

According to the heating step of the invention, the supplying step and relocating and measuring step relative to the DUTs on the other tray are completed during the heating step relative to the DUTs on the one tray. There is a case where the heating step is not completed during the relocating and measuring step and the supplying step depending on the package shapes of the DUTs 110 or measurement condition including temperature. In such a case, the number of trays and the tray moving mechanism are increased, so that heating step can take time as long as the time taken by the relocating and measuring step and the supplying step for one stage of tray. Since each tray is thin in thickness, even if the size of the heating chamber 140 or a power supply capacity for heating the heating chamber 140 is not increased, it is possible to increase the number of DUTs 110 to be heated by merely increasing the number of trays.

As described in detail above, according to the apparatus for and the method of heating semiconductor devices of the invention, they can cope with a variety of semiconductor devices at low cost by use of standardized trays, and further, they can efficiently heat a variety of semiconductor devices while restraining the large sizing of the apparatus and the increase of the power supply capacity by merely disposing the trays in multiple stages.

What is claimed is:

1. A heating apparatus for semiconductor devices comprising:
    plural trays on which multiple semiconductor devices are mounted;
    a heating chamber having two stages disposed vertically one above the other in which each tray is housed; and
    a tray moving mechanism for moving each said tray inside and outside the heating chamber.

2. The heating apparatus for semiconductor devices according to claim 1, wherein each said tray is standardized and the tray moving mechanism has plural plates for holding and placing the plural trays thereon.

3. The heating apparatus for semiconductor devices according to claim 1, further comprising heat units for keeping the semiconductor devices warm at an intended temperature, and wherein the semiconductor devices are moved from an inside of the heating chamber to an outside thereof in a state where they are each placed on one of said trays.

4. The heating apparatus for semiconductor devices according to claim 3, wherein the heat units each have a blower for blowing hot air toward the semiconductor devices.

5. A method of heating semiconductor devices in a heating apparatus including plural trays on each of which multiple semiconductor devices are mounted, a heating chamber having two stages disposed vertically one above the other in each of which a said tray is housed, and a tray moving mechanism for moving each said tray into and out of the heating chamber, said method comprising a supplying step for supplying semiconductor devices on each said tray, a heating step for heating the semiconductor devices supplied on each said tray to an intended temperature, a step for relocating and measuring the semiconductor devices which are heated in the heating step, wherein these steps are repeated, and wherein the supplying step and the relocating and heating step relative to a first said tray are completed during the heating step relative to a second said tray.

6. The heating apparatus for semiconductor devices according to claim 1, wherein each said tray is disposed on an upper surface of a plate, a substantially horizontally oriented linear guide is fixedly disposed to said heating chamber and slidably supports said plate, and said plate and said tray thereon move in unison in a substantially horizontal direction along the guide so that said tray can be moved to be disposed inside and outside of said heating chamber.

7. The heating apparatus for semiconductor devices according to claim 1, wherein said tray moving mechanism is a ball screw disposed outside said heating chamber, said tray is disposed on a top surface of a plate, and said ball screw threadably engaging with said plate to move said plate in one substantially horizontal direction out of said heating chamber and in an opposite substantially horizontal direction into said heating chamber.

8. The heating apparatus for semiconductor devices according to claim 1, wherein a hand supplies the semiconductor devices to said tray and retrieves the semiconductor devices from said tray.

9. A heating apparatus for semiconductor devices comprising:
    plural trays on which multiple semiconductor devices are mounted;
    a heating chamber having plural stages for housing said trays and an access opening adjacent one end thereof for permitting said trays to be inserted therein and removed therefrom;
    a tray moving mechanism for moving each said tray inside and outside the heating chamber;
    a heating unit disposed adjacent said access opening for heating the semiconductor devices disposed on the tray as removed from the heating chamber; and
    a hand disposed adjacent the heating unit to retrieve the heated semiconductor devices from the tray being removed from the heating chamber.

10. The heating apparatus according to claim 9, wherein the heating unit is a blower for directing heated air across the access opening into the semiconductor devices disposed on the tray being removed.

11. The method of heating semiconductor devices of claim 5, including a hand for said supplying step to supply the semiconductor devices on said tray in a plurality of adjacent recesses disposed in consecutive rows.

12. The method of heating semiconductor devices of claim 5, including providing a first tray moving step after said supplying step for moving one of said trays to be disposed inside of said heating chamber before said heating step.

13. The method of heating semiconductor devices of claim 12, including providing a second tray moving step after said heating step for moving one of said trays to be disposed outside of said heating chamber before said relocating and measuring step.

14. The method of heating semiconductor devices of claim 5, including providing a hand for said relocating and measuring step for relocating the semiconductor devices from said tray and holding the semiconductor device in a position for measuring.

15. A method of heating semiconductor devices in a heating apparatus including plural trays on each of which multiple semiconductor devices are mounted, a heating chamber having plural stages in each of which a said tray is housed, a hand for relocating the semiconductor devices from said tray and holding the semiconductor device in a position for measuring, a heating unit fixedly disposed to said heating chamber for moving hot air across the semiconductor device as it is being held by said hand, and a tray moving mechanism for moving each said tray into and out of the heating chamber, said method comprising a supplying step for supplying semiconductor devices on each said tray, a heating step for heating the semiconductor devices supplied on each said tray to an intended temperature, a step for relocating and measuring the semiconductor devices which are heated in the heating step, wherein these steps are repeated, and wherein the supplying step and the relocating and heating step relative to a first said tray are completed during the heating step relative to a second said tray.

16. The method of heating semiconductor devices of claim 5, wherein said relocating and measuring step occurs in a step by step manner corresponding to rows on said tray.

17. The method of heating semiconductor devices of claim 5, including providing access openings at one end of said heating chamber.

* * * * *